United States Patent
Hsu

(10) Patent No.: US 10,491,220 B1
(45) Date of Patent: Nov. 26, 2019

(54) VOLTAGE CIRCUIT AND METHOD OF OPERATING THE SAME

(71) Applicant: NANYA TECHNOLOGY CORPORATION, New Taipei (TW)

(72) Inventor: Ping Hsu, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/250,662

(22) Filed: Jan. 17, 2019

Related U.S. Application Data

(60) Provisional application No. 62/770,956, filed on Nov. 23, 2018.

(51) Int. Cl.
*H03K 3/00* (2006.01)
*H03K 19/0185* (2006.01)
*H03K 19/003* (2006.01)

(52) U.S. Cl.
CPC .............. *H03K 19/018521* (2013.01); *H03K 19/00315* (2013.01); *H03K 19/00384* (2013.01)

(58) Field of Classification Search
CPC ....... H03K 19/0013; H03K 19/018521; H03K 19/018528; H03K 19/00315; H03K 19/00384; H03K 3/356113; G11C 8/08; G11C 5/145; G11C 7/12
See application file for complete search history.

(56) References Cited

U.S. PATENT DOCUMENTS

| | | | |
|---|---|---|---|
| 4,521,695 A | 6/1985 | Mazin et al. | |
| 6,750,696 B2 | 6/2004 | Shimada et al. | |
| 7,224,202 B2 | 5/2007 | Pauletti | |
| 7,880,501 B2 * | 2/2011 | Han | G09G 3/3696 326/68 |
| 8,547,747 B2 | 10/2013 | Kshirsagar | |
| 8,610,490 B2 | 12/2013 | Marotta et al. | |
| 9,300,296 B2 | 3/2016 | Ilgenstein et al. | |
| 2018/0287613 A1 * | 10/2018 | Lee | H03K 19/018521 |

* cited by examiner

*Primary Examiner* — Long Nguyen
(74) *Attorney, Agent, or Firm* — Muncy, Geissler, Old & Lowe, P.C.

(57) ABSTRACT

The present disclosure provides a voltage circuit. The voltage circuit includes a first input signal-inverting circuit, a second input signal-inverting circuit, a first level-shifting circuit, a second level-shifting circuit, a first diode circuit and a second diode circuit. The first input signal-inverting circuit receives an input signal and outputs a first inverted signal. The second input signal-inverting circuit receives the first inverted signal and outputs a second inverted signal. The first level-shifting circuit determines a voltage level of a first output node in response to the first and second inverted signals. The second level-shifting circuit determines a voltage level of a second output node in response to the first and second inverted signals. The first diode circuit is connected between a first voltage-supplying node and the first output node. The second diode circuit is connected between a second voltage-supplying node and the second output node.

20 Claims, 6 Drawing Sheets

VOLTAGE CIRCUIT AND METHOD OF OPERATING THE SAME

PRIORITY CLAIM AND CROSS-REFERENCE

This application claims the priority benefit of U.S. provisional patent application No. 62/770,956, filed on Nov. 23, 2018. The entirety of the above-mentioned patent application is hereby incorporated by reference herein and made a part of this specification.

TECHNICAL FIELD

The present disclosure relates to an integrated circuit and an operating method, and more particularly, to a voltage circuit and a method of operating a voltage circuit.

DISCUSSION OF THE BACKGROUND

In an integrated circuit, it is common to receive signals from an external device. In addition, it is common to translate signals between an internal circuit and an external circuit in the integrated circuit.

In order to allow compatibility between different circuits, it may be required to modify a maximum voltage level and a minimum voltage level of the signals when the integrated circuit transmits or receives the signals.

Therefore, a circuit configured to stably vary the maximum voltage level and the minimum voltage level of the signal may be required.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a voltage circuit. The voltage circuit includes a first input signal-inverting circuit, a second input signal-inverting circuit, a first level-shifting circuit, a second level-shifting circuit, a first diode circuit and a second diode circuit. The first input signal-inverting circuit is configured to receive an input signal and output a first inverted signal. The second input signal-inverting circuit is configured to receive the first inverted signal from the first input signal-inverting circuit and output a second inverted signal. The first level-shifting circuit is configured to determine a voltage level of a first output node in response to the first and second inverted signals from the first and second input signal-inverting circuits. The second level-shifting circuit is configured to determine a voltage level of a second output node in response to the first and second inverted signals from the first and second input signal-inverting circuits. In some embodiments, the first diode circuit is connected between a first voltage-supplying node and the first output node. In some embodiments, the second diode circuit is connected between a second voltage-supplying node and the second output node.

In some embodiments, a phase of the first inverted signal is different from a phase of the second inverted signal.

In some embodiments, a maximum voltage level and a minimum voltage level of the first output node are different from a maximum voltage level and a minimum voltage level of the second output node.

In some embodiments, the first diode circuit includes a first number of diodes, and the second diode circuit includes a second number of diodes.

In some embodiments, the diodes of the first diode circuit are serially connected between the first voltage-supplying node and the first output node, and the diodes of the second diode circuit are serially connected between the second voltage-supplying node and the second output node.

In some embodiments, the first number is equal to the second number.

In some embodiments, the first number is different from the second number.

In some embodiments, the first voltage-supplying node provides a positive voltage and the second voltage-supplying node provides a negative voltage.

In some embodiments, the first diode circuit includes a first switch circuit connected to the diodes of the first diode circuit and configured to control a connection state of one of the diodes of the first diode circuit.

In some embodiments, the second diode circuit includes a second switch circuit connected to the diodes of the second diode circuit and configured to control a connection state of one of the diodes of the second diode circuit.

In some embodiments, the voltage circuit further comprises a first output circuit connected to the first output node and configured to output an output signal in response to the voltage level of the first output node.

In some embodiments, the voltage circuit further comprises a second output circuit connected to the second output node and configured to output an output signal in response to the voltage level of the second output node.

In some embodiments, the first output circuit comprises a first inverter configured to invert the voltage level of the first output node, and the second output circuit comprises a second inverter configured to invert the voltage level of the second output node.

In some embodiments, the first diode circuit is connected between the first voltage-supplying node and the first inverter, and configured to create a voltage decrease so that the first inverter is operated by a decreased voltage and a ground voltage, wherein the decreased voltage is lower than a supply voltage of the first voltage-supplying node and higher than the ground voltage.

In some embodiments, the second diode circuit is connected between the second voltage-supplying node and the second inverter, and configured to create a voltage increase so that the second inverter operated by an increased voltage and an external voltage, wherein the increased voltage is higher than a supply voltage of the second voltage-supplying node and lower than the external voltage.

Another aspect of the present disclosure provides a method of operating a voltage circuit. The method comprises the following steps. A first input signal is received and inverted, and a first inverted signal is output. The first inverted signal is received and inverted, and a second inverted signal is output. A voltage level of a first output node is determined in response to the first and second inverted signals. A voltage level of a second output node is determined in response to the first and second inverted signals. A voltage between a first voltage-supplying node and the first output node is decreased. A voltage between a second voltage-supplying node and the second output node is increased.

In some embodiments, the first voltage-supplying node provides a positive voltage and the second voltage-supplying node provides a negative voltage.

In some embodiments, a maximum voltage level and a minimum voltage level of the first output node are different from a maximum voltage level and a minimum voltage level of the second output node, respectively.

In some embodiments, the method further comprises configuring a first diode circuit to determine a decrease in voltage between the first voltage-supplying node and the first output node.

In some embodiments, the method further comprises configuring a second diode circuit to determine an increase in voltage between the second voltage-supplying node and the second output node.

With the above-mentioned configurations of the voltage, a maximum voltage level and a minimum voltage level of the input signal are adjusted. Consequently, the signal can be translated to different circuits.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description.

DETAILED DESCRIPTION

Figure 1:
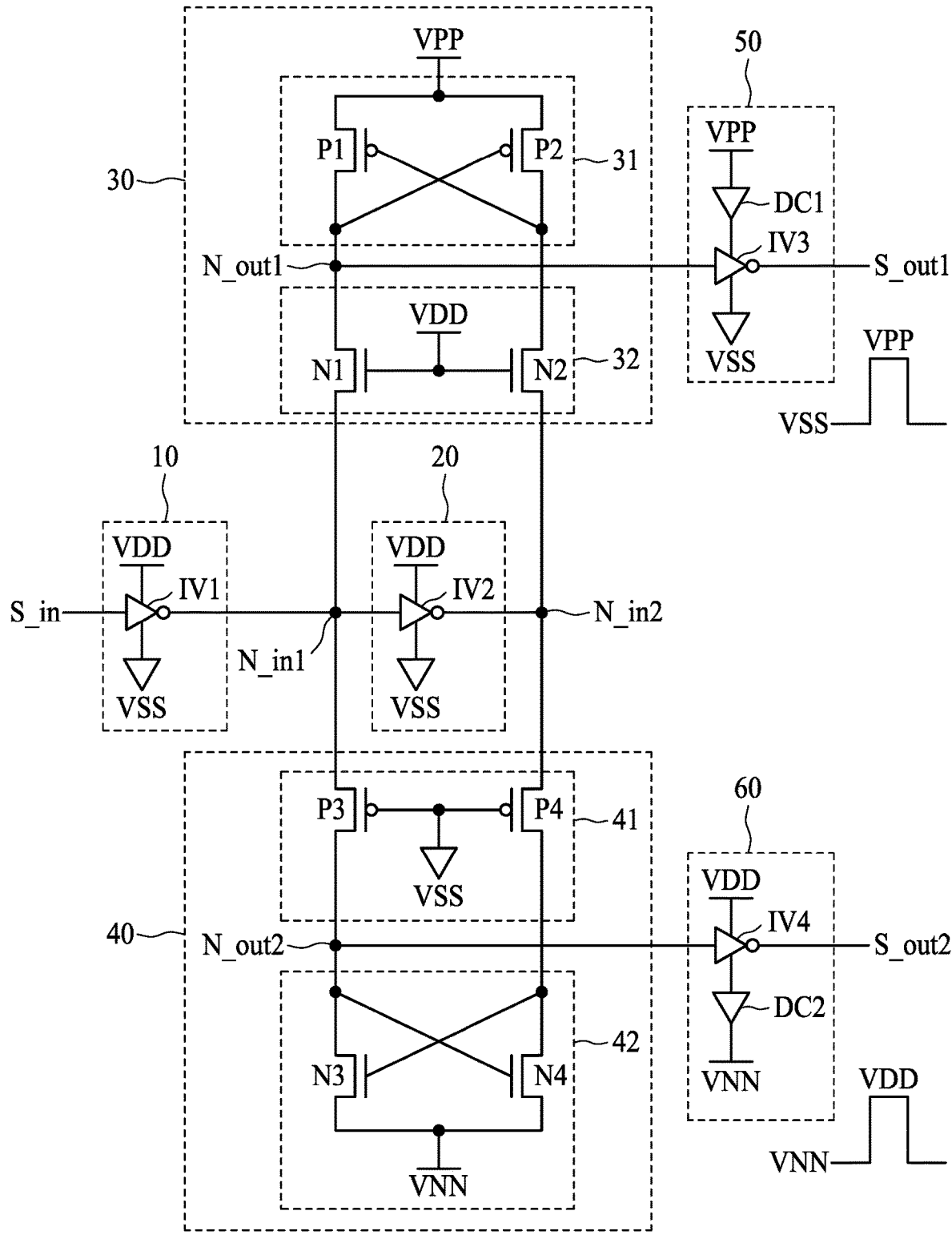
FIG. 1 is a circuit diagram illustrating a voltage circuit in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a circuit diagram illustrating a voltage circuit 100 in accordance with some embodiments of the present disclosure.

Referring to FIG. 1, the voltage circuit 100 according to an embodiment may include a first input signal-inverting circuit 10, a second input signal-inverting circuit 20, a first level-shifting circuit 30, a second level-shifting circuit 40, a first output circuit 50, a second output circuit 60, a first diode circuit DC1 and a second diode circuit DC2.

The first input signal-inverting circuit 10 may receive an input signal S_in. Further, the first input signal-inverting circuit 10 may invert the received input signal S_in and output an inverted input signal S_in to a first input node N_in1.

The first input signal-inverting circuit 10 may include a first inverter IV1. The first inverter IV1 may be operated by an external voltage VDD and a ground voltage VSS. In such arrangement, a maximum voltage level of the output signal from the first inverter IV1 substantially corresponds to the external voltage VDD, and a minimum voltage level of the output signal from the first inverter IV1 substantially corresponds to the ground voltage VSS.

The second input signal-inverting circuit 20 may invert the output signal from the first input signal-inverting circuit 10. The second input signal-inverting circuit 20 may output the inverted output signal to a second input node N_in2 A phase of the inverted input signal is different from a phase of the inverted output signal.

The second input signal-inverting circuit 20 may include a second inverter IV2. The second inverter IV2 may be operated by the external voltage VDD and the ground voltage VSS. In such arrangement, a maximum voltage level of the output signal from the second inverter IV2 substantially corresponds to the external voltage VDD, and a minimum voltage level of the output signal from the second inverter IV2 substantially corresponds to the ground voltage VSS.

The first level-shifting circuit 30 may be configured to determine a voltage level of a first output node S_out1 in response to the voltage levels of the first and second input nodes N_in1 and N_in2 The first level-shifting circuit 30 may receive a pumping voltage VPP. The first level-shifting circuit 30 may be operated by the pumping voltage VPP. For example, when the voltage of the first input node N_in1 is at the level of the external voltage VDD and the voltage of the second input node N_in2 is at the level of the ground voltage VSS, the voltage level of the first output node S_out1 may be increased to the pumping voltage VPP by the first level-shifting circuit 30. In contrast, when the voltage of the first input node N_in1 is at the level of the ground voltage VS S and the voltage of the second input node N_in2 is at the level of the external voltage VDD, the voltage level of the first output node S_out1 may be decreased to the level of the ground voltage VSS by the first level-shifting circuit 30.

The first level-shifting circuit 30 may include a first signal transmission circuit 31 and a first latch circuit 32.

The first signal transmission circuit 31 may transmit any one of the voltage levels of the first and second input nodes N_in1 and N_in2 to the first latch circuit 32 in response to the voltage levels of the first and second input nodes N_in1 and N_in2 For example, the first signal transmission circuit 31 may transmit a voltage of an input node having a relatively low voltage level among the voltage levels of the first and second input nodes N_in1 and N_in2 to the first latch circuit 32. In particular, when the voltage of the first input node N_in1 is at the level of the external voltage VDD and the voltage of the second input node N_in2 is at the level of the ground voltage VSS, the first signal transmission circuit 31 may transmit the voltage of the first input node N_intA to the first latch circuit 32. In contrast, when the voltage of the first input node N_in1 is at the level of the ground voltage VSS and the voltage of the second input node N_in2 is at the level of the external voltage VDD, the first signal transmission circuit 31 may transmit the voltage of the second input node N_in2 to the first latch circuit 32.

The first signal transmission circuit 31 may include a first transistor N1 and a second transistor N2. The first transistor N1 may include a gate to which the external voltage VDD may be applied, a source connected to the first input node N_in1, and a drain connected to the first latch circuit 32. The second transistor N2 may include a gate to which the external voltage VDD may be applied, a source connected to the second input node N_in2, and a drain connected to the first latch circuit 32.

The first latch circuit 32 may be configured to determine the voltage level of the first output node S_out1 in response to any one of the voltage levels of the first and second input nodes N_in1 and N_in2 transmitted from the first signal transmission circuit 31. For example, when the ground voltage VSS of the first input node N_in1 is transmitted from the first signal transmission circuit 31, the first latch circuit 32 may provide the ground voltage VSS to the first output node S_out1. In contrast, when the ground voltage VSS of the second input node N_in2 is transmitted from the first signal transmission circuit 31, the first latch circuit 32 may provide the pumping voltage VPP to the first output node S_out1.

The first latch circuit 32 may include a third transistor P1 and a fourth transistor P2. The third transistor P1 may include a gate connected to the second transistor N2 of the first signal transmission circuit 31, a source to which the pumping voltage VPP may be applied, and a drain connected to the first transistor N1 of the first signal transmission circuit 31. The fourth transistor P2 may include a gate connected to the first transistor N1 of the first signal transmission circuit 31, a source to which the pumping voltage VPP may be applied, and a drain connected to the second transistor N2 of the first signal transmission circuit 31.

The second level-shifting circuit 40 may be configured to determine a voltage level of a second output node N_out2 in response to the voltage levels of the first and second input nodes N_in1 and N_in2 The second level-shifting circuit 40 may receive a negative voltage VNN. The second level-shifting circuit 40 may be operated by the negative voltage VNN. For example, when the voltage of the first input node N_in1 is at the level of the external voltage VDD and the voltage of the second input node N_in2 is at the level of the ground voltage VSS, the second level-shifting circuit 40 may increase the voltage level of the second output node N_out2 to the level of the external voltage VDD. In contrast, when the voltage of the first input node N_in1 is at the level of the ground voltage VSS and the voltage of the second input node N_in2 is at the level of the external voltage VDD, the second level-shifting circuit 40 may decrease the voltage level of the second output node N_out2 to the level of the negative voltage VNN.

The second level-shifting circuit 40 may include a second signal transmission circuit 41 and a second latch circuit 42. In some embodiments, the second signal transmission circuit 41 may transmit any one of the voltage levels of the first and second input nodes N_in1 and N_in2 to the second latch circuit 42 in response to the voltage levels of the first and second input nodes N_in1 and N_in2. For example, the second signal transmission circuit 41 may transmit a voltage of an input node having a relatively high voltage level among the voltage levels of the first and second input nodes N_in1 and N_in2 to the second latch circuit 42. In particular, when the voltage of the first input node N_in1 is at the level of the ground voltage VSS and the voltage of the second input node N_in2 is at the level of the external voltage VDD, the second signal transmission circuit 41 may transmit the voltage of the second input node N_in2 to the second latch circuit 42. In contrast, when the voltage of the first input node N_in1 is at the level of the external voltage VDD and the voltage of the second input node N_in2 is at the level of the ground voltage VSS, the second signal transmission circuit 41 may transmit the voltage of the first input node N_in1 to the second latch circuit 42.

The second signal transmission circuit 41 may include a fifth transistor P3 and a sixth transistor P4. The fifth transistor P3 may include a gate to which the ground voltage VSS may be applied, a source connected to the first input node N_in1, and a drain connected to the second latch circuit 42. The sixth transistor P4 may include a gate to which the ground voltage VSS may be applied, a source connected to the second input node N_in2, and a drain connected to the second latch circuit 42.

The second latch circuit 42 may be configured to determine the voltage level of the second output node N_out2 in response to any one of the voltage levels of the first and second input nodes N_in1 and N_in2 transmitted from the second signal transmission circuit 41. For example, when the external voltage VDD of the first input node N_in1 is transmitted from the second signal transmission circuit 41, the second latch circuit 42 may provide the external voltage VDD to the second output node N_out2. In contrast, when the external voltage VDD of the second input node N_in2 is transmitted from the second signal transmission circuit 41, the second latch circuit 42 may provide the negative voltage VNN to the second output node N_out2.

The second latch circuit 42 may include a seventh transistor N3 and an eighth transistor N4. The seventh transistor N3 may include a gate connected to the sixth transistor P4 of the second signal transmission circuit 41, a source to which the negative voltage VNN may be applied, and a drain connected to the fifth transistor P3 of the second signal transmission circuit 41. The eighth transistor N4 may include a gate connected to the fifth transistor P3 of the second signal transmission circuit 41, a source to which the negative voltage VNN may be applied, and a drain connected to the sixth transistor P4 of the second signal transmission circuit 41.

The first output circuit 50 may output a first output signal S_out1 in response to the voltage level of the first output node S_out1. For example, when the voltage of the first output node S_out1 is at the level of the ground voltage VSS, the first output circuit 50 may output the first output signal S_out1 having the voltage level proximate to the pumping voltage VPP. In contrast, when the voltage of the first output node S_out1 is at the level of the pumping voltage VPP, the first output circuit 50 may output the first output signal S_out1 having the voltage level proximate to the ground voltage VSS.

The first output circuit 50 may include a third inverter IV3. The third inverter IV3 may invert the voltage of the first output node S_out1 to output the first output signal S_out1. The first output circuit 50 may further include a first diode circuit DC1. The first diode circuit DC1 may be connected between the pumping voltage VPP and the inverter IV3 so that a first new voltage level proximate to the pumping voltage VPP, for example, VPP-0.7 V, and the ground voltage VSS may be applied to the third inverter IV3. Thus, the third inverter IV3 may be operated by the first new voltage and the ground voltage VSS.

The second output circuit 60 may output a second output signal S_out2 in response to the voltage level of the second output node N_out2. For example, when the voltage of the second output node N_out2 is at the level of the negative voltage VNN, the second output circuit 60 may output the second output signal S_out2 having the voltage level of the external voltage VDD. In contrast, when the voltage of the second output node N_out2 is at the level of the external voltage VDD, the second output circuit 60 may output the second output signal S_out2 having the voltage level of the negative voltage VNN.

The second output circuit 60 may include a fourth inverter IV4. The fourth inverter IV4 may invert the voltage of the second output node N_out2 to output the second output signal S_out2. The second output circuit 60 may further include a second diode circuit DC2. The second diode circuit DC2 may be connected between the negative voltage VNN and the inverter IV4 so that a second new voltage level proximate to the negative voltage VNN, for example, VNN+0.7 V, and the external voltage VDD may be applied to the fourth inverter IV4. Thus, the fourth inverter IV4 may be operated by the second new voltage and the external voltage VDD.

Figure 2:
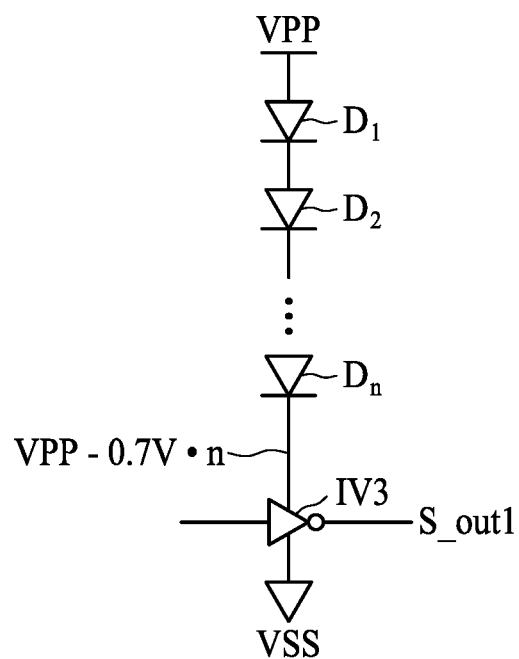
FIG. 2 is a circuit diagram illustrating a first diode circuit of the voltage circuit in accordance with some embodiments of the present disclosure.

FIG. 2 is a circuit diagram illustrating the first diode circuit DC1 of the voltage circuit 100 in accordance with some embodiments of the present disclosure. Referring to FIG. 2, in some embodiments, the first diode circuit DC1 includes a number of diodes that are serially connected between a first voltage-supplying node (the pumping voltage) VPP and the third inverter IV3. With this arrangement, the first new voltage level may be further reduced to VPP-0.7V*n. The number n can be selected based on the desired maximum voltage level of the first output node N_out_A.

Figure 3:
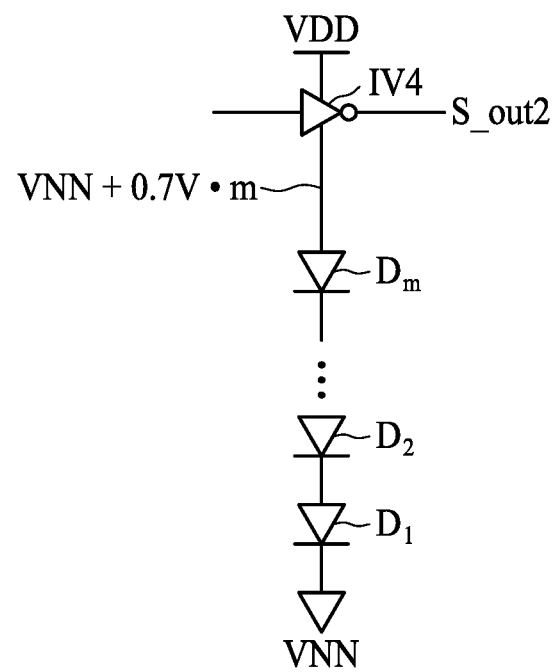
FIG. 3 is a circuit diagram illustrating a second diode circuit of the voltage circuit in accordance with some embodiments of the present disclosure.

FIG. 3 is a circuit diagram illustrating the second diode circuit DC2 of the voltage circuit 100 in accordance with some embodiments of the present disclosure. Referring to FIG. 3, in some embodiments, the second diode circuit DC2 includes in number of diodes that are serially connected between a second voltage-supplying node (the negative voltage) VNN and the fourth inverter IV4. With this arrangement, the second new voltage level may be further increased to VNN+0.7V*m. The number in can be selected based on the desired minimum voltage level of the second output node N_out_B. In some embodiments, the number n is equal to the number in so that the voltage decrease from the pumping voltage VPP to the first new voltage level is equal to the voltage increase from the negative voltage VNN to the second new voltage level. In some embodiments, the number n is different from the number in so that the voltage decrease from the pumping voltage VPP to the first new voltage level is different from the voltage increase from the negative voltage VNN to the second new voltage level.

Figure 4:
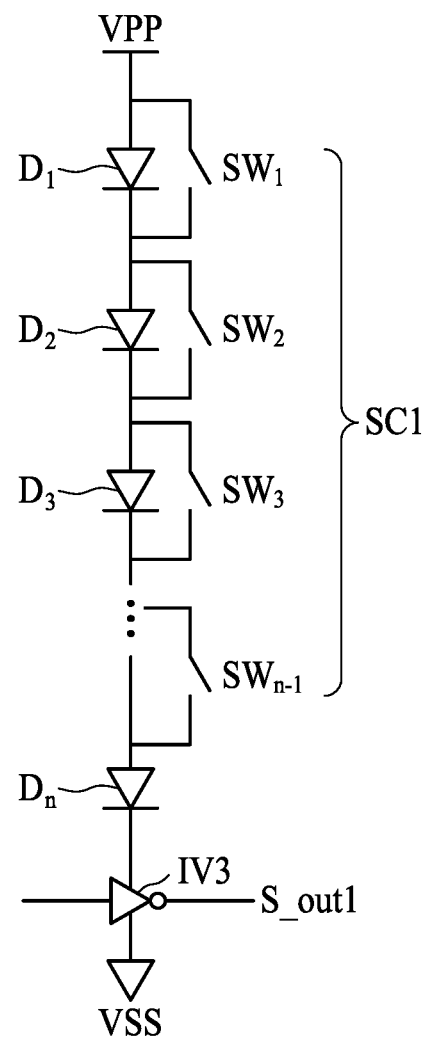
FIG. 4 is a circuit diagram illustrating a first switch circuit of the voltage circuit in accordance with some embodiments of the present disclosure.

FIG. 4 is a circuit diagram illustrating a first switch circuit SC1 of the voltage circuit 100 in accordance with some embodiments of the present disclosure. Referring to FIG. 4, the first switch circuit SC1 includes a plurality of switches SW1, SW2, . . . , SWn−1 configured to control a connection state of respective one of the n number of diodes. For example, the first switch SW1 bypasses the first diode D1 so that when the first switch SW1 is on, the first diode D1 is skipped. In other words, no current flows through the first diode. In contrast, when the first switch SW1 is off, the connection state of the first diode is on. Similarly, the second switch SW2 bypasses the first diode D2 so that when the second switch SW2 is on, the first diode D2 is skipped. In this embodiment, there is no switch circuit bypassing the nth diode Dn so that the connection state of diode Dn is always on and a voltage decrease of at least 0.7V from the pumping voltage VPP to the third inverter IV3 can be guaranteed.

Figure 5:
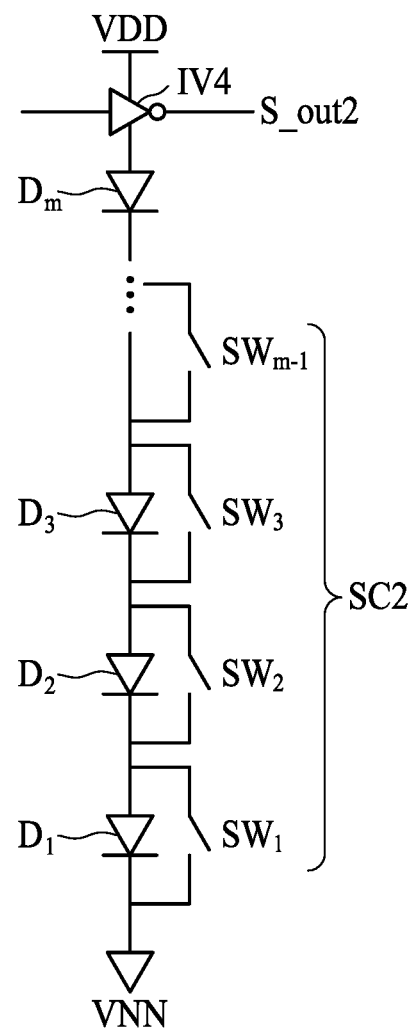
FIG. 5 is a circuit diagram illustrating a second switch circuit of the voltage circuit in accordance with some embodiments of the present disclosure.

FIG. 5 is a circuit diagram illustrating a second switch circuit SC2 of the voltage circuit 100 in accordance with some embodiments of the present disclosure. Referring to FIG. 5, the second switch circuit SC2 includes a plurality of switches SW1, SW2, . . . , SWm−1 configured to control a connection state of one of the in number of diodes. For example, the first switch SW1 bypasses the first diode D1 so that when the first switch SW1 is on, the first diode D1 is skipped. In other words, no current flows through the first diode. In contrast, when the first switch SW1 is off, the connection state of the first diode is on. Similarly, the second switch SW2 bypasses the first diode D2 so that when the second switch SW2 is on, the first diode D2 is skipped. In this embodiment, there is no switch circuit bypassing the mth diode Din so that the connection state of diode Din is always on and a voltage increase at least 0.7V from the negative voltage VNN to the fourth inverter IV4 can be guaranteed.

Figure 6:
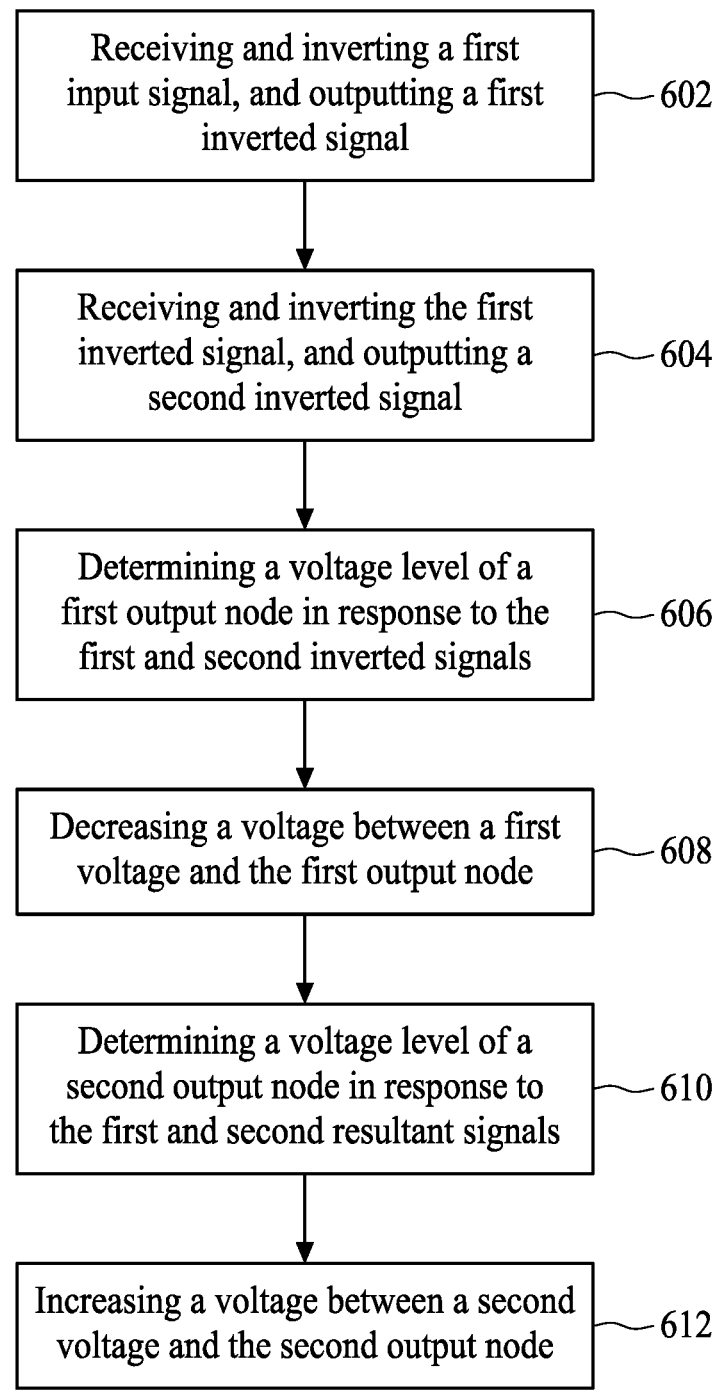
FIG. 6 is a flowchart showing a method for operating a voltage circuit in accordance with some embodiments of the present disclosure.

FIG. 6 is a flowchart showing a method 600 for operating a voltage circuit in accordance with some embodiments of the present disclosure. In some embodiments, the method 600 includes a number of operations (602, 604, 606, 608, 610 and 612) and the description and illustrations below are not deemed as a limitation to the sequence of the operations.

In operation 602, the input signal S_in may be received and inverted by the first input signal-inverting circuit 10, and an inverted signal is output. For example, when the input signal S_in is at a high level, the first input signal-inverting circuit 10 may output the inverted output signal at the level of the ground voltage VSS.

In operation 604, the inverted output signal output by the first input signal-inverting circuit 10 may be received and inverted by the second input signal-inverting circuit 20, and an inverted signal is output. For example, the second input signal-inverting circuit 20 may output the output signal of the first input signal-inverting circuit 10 at the level of the external voltage VDD. Thus, the first input node N_in1 is at the level of the ground voltage VSS. The second input node N_in2 is at the level of the external voltage VDD.

The first signal transmission circuit 31 may transmit the low voltage of the input node among the first and second input nodes N_in1 and N_in2 to the first latch circuit 32. Therefore, the first signal transmission circuit 31 may transmit the voltage of the first input node N_in1 to the first latch circuit 32.

In particular, the first signal transmission circuit 31 may include the first and second transistors N1 and N2. Because the external voltage VDD may be applied to the gates of the first and second transistors N1 and N2, turning on of the first and second transistors N1 and N2 may be determined in accordance with the voltage level inputted into the sources. When the voltage level of the first input node N_in1 is at the level of the ground voltage VSS and the voltage level of the second input node N_in2 is at the level of the external voltage VDD, the first transistor N1 may be turned on and the second transistor N2 may be turned off. Thus, the voltage of the first input node N_in1 may be transmitted to the first latch circuit 32 through the turned-on first transistor N1.

In operation 606, the voltage level of the first output node S_out1 is determined in response to the inverted signals output by the first and second input signal-inverting circuits 10 and 20. For example, when the first latch circuit 32 receives the ground voltage VSS of the first input node N_in1, the fourth transistor P2 may be turned on and the third transistor P1 may be turned off. Thus, the first output node S_out1 may be connected to the first input node N_in1 so that the voltage level of the first output node S_out1 may be changed to the level of the ground voltage VSS.

In operation 608, the voltage between the pumping voltage VPP level and the first output node S_out1 is decreased. For example, when the voltage of the first output node S_out1 changes to the level of the ground voltage VSS, the first output circuit 50 may output the first output signal S_out1 with a voltage level decreased from the level of the pumping voltage VPP, depending on the connection state of the first diode circuit DC1.

As mentioned above, when the input signal S_in is at the high level, the first input node N_in1 may be changed to the level of the ground voltage VSS and the second input node N_in2 may be changed to the level of the external voltage VDD.

The second signal transmission circuit 41 may transmit the high voltage of the input node among the first and second input nodes N_in1 and N_in2 to the second latch circuit 42. Therefore, the second signal transmission circuit 41 may transmit the voltage of the second input node N_in2 to the second latch circuit 42.

In particular, the second signal transmission circuit 41 may include the fifth and sixth transistors P3 and P4. Because the ground voltage VSS may be applied to the gates of the fifth and sixth transistors P3 and P4, turning on of the fifth and sixth transistors P3 and P4 may be determined in accordance with the voltage level inputted into the sources. When the voltage of the first input node N_in1 is at the level of the ground voltage VSS and the voltage of the second input node N_in2 is at the level of the external voltage VDD, the sixth transistor P4 may be turned on and the fifth transistor P3 may be turned off. Thus, the voltage of the second input node N_in2 may be transmitted to the second latch circuit 42 through the turned-on sixth transistor P4.

In operation 610, the voltage level of the first output node S_out1 is determined in response to the inverted signals output by the first and second input signal-inverting circuits 10 and 20. When the second latch circuit 42 receives the external voltage VDD of the second input node N_in2, the seventh transistor N3 may be turned on so that the voltage of the second output node N_out2 may be changed to the level of the negative voltage VNN.

When the voltage of the second output node N_out2 changes to the level of the negative voltage VNN, the second output circuit 60 may output the second output signal S_out2 having the voltage level of the external voltage VDD.

When the input signal S_in is at a low level, the first input signal-inverting circuit 10 may output the output signal at the voltage level of the external voltage VDD. The second input signal-inverting circuit 20 may output the output signal of the first input signal-inverting circuit 10 at the voltage level of the ground voltage VSS. Thus, the first input node N_in1 is at the voltage level of the external voltage VDD. The second input node N_in2 is at the voltage level of the ground voltage VSS.

The first signal transmission circuit 31 may transmit the low voltage of the input node among the first and second input nodes N_in1 and N_in2 to the first latch circuit 32. Therefore, the first signal transmission circuit 31 may transmit the voltage of the second input node N_in2 to the first latch circuit 32.

In particular, the first signal transmission circuit 31 may include the first and second transistors N1 and N2. Because the external voltage VDD is applied to the gates of the first and second transistors N1 and N2, turning on of the first and second transistors N1 and N2 may be determined in accordance with the voltage level inputted into the sources. When the voltage of the first input node N_in1 is at the level of the external voltage VDD and the voltage level of the second input node N_in2 is at the level of the ground voltage VSS, the first transistor N1 may be turned off and the second transistor N2 may be turned on. Thus, the voltage of the second input node N_in2 may be transmitted to the first latch circuit 32 through the turned-on second transistor N2.

When the first latch circuit 32 receives the ground voltage VSS of the second input node N_in2, the third transistor P1 may be turned on so that the voltage of the first output node S_out1 may be changed to the level of the pumping voltage VPP.

When the voltage level of the first output node S_out1 changes to the level of the pumping voltage VPP, the first output circuit 50 may output the first output signal S_out1 having the voltage level of the ground voltage VSS.

As mentioned above, when the input signal S_in is at the low level, the first input node N_in1 may change to the voltage level of the external voltage VDD and the second input node N_in2 may change to the voltage level of the ground voltage VSS.

The second signal transmission circuit 41 may transmit the high voltage of the input node among the first and second input nodes N_in1 and N_in2 to the second latch circuit 42. Therefore, the second signal transmission circuit 41 may transmit the voltage of the first input node N_in1 to the second latch circuit 42.

In particular, the second signal transmission circuit 41 may include the fifth and sixth transistors P3 and P4. Because the ground voltage VSS may be applied to the gates of the fifth and sixth transistors P3 and P4, turning on of the fifth and sixth transistors P3 and P4 may be determined in accordance with the voltage level inputted into the sources. When the voltage of the first input node N_in1 is at the level of the external voltage VDD and the voltage of the second input node N_in2 is at the level of the ground voltage VSS, the fifth transistor P3 may be turned on and the sixth transistor P4 may be turned off. Thus, the voltage of the first input node N_in1 may be transmitted to the second latch circuit 42 through the turned-on fifth transistor P3.

When the second latch circuit 42 receives the external voltage VDD of the first input node N_in1, the eighth transistor N4 may be turned on and the seventh transistor N3 may be turned off. The second output node N_out2 may be connected to the first input node N_in1 so that the voltage of the second output node N_out2 may change to the level of the external voltage VDD.

In operation 612, the voltage between the negative voltage VNN and the second output node S_out2 is increased. For example, when the voltage level of the second output node N_out2 changes to the level of the external voltage VDD, the second output circuit 60 may output the second output signal S_out2 at a voltage level increased from the negative voltage VNN level, depending on the connection state of the second diode circuit DC2.

According to some embodiments, the voltage circuit 100 may output the output signals having different maximum voltage levels and different minimum voltage levels in response to the single input signal S_in. Further, because the external voltage may be applied to the gates and the sources of the turned-off first transistor N1 or second transistor N2, and the ground voltage may be applied to the sources of the turned-off fifth transistor P3 or sixth transistor P4, stresses between the gate and the source, and between the drain and the source in the transistors of the first and second signal transmission circuits 31 and 41, may be reduced. Furthermore, the turning on and the turning off of the transistors of the first and second signal transmission circuits 31 and 41 may be controlled by the voltage level changes of the drains and sources, respectively, rather than the gates.

In conclusion, in some embodiments of the present disclosure, with the above-mentioned configurations of the voltage, a maximum voltage level and a minimum voltage level of the input signal are adjusted. Consequently, the signal can be translated to different circuits.

One aspect of the present disclosure provides a voltage circuit. The voltage circuit includes a first input signal-inverting circuit, a second input signal-inverting circuit, a first level-shifting circuit, a second level-shifting circuit, a first diode circuit and a second diode circuit. The first input signal-inverting circuit is configured to receive an input signal and output a first inverted signal. The second input signal-inverting circuit is configured to receive the first inverted signal from the first input signal-inverting circuit and output a second inverted signal. The first level-shifting circuit is configured to determine a voltage level of a first output node in response to the first and second inverted signals from the first and second input signal-inverting circuits. The second level-shifting circuit is configured to determine a voltage level of a second output node in response to the first and second inverted signals from the first and second input signal-inverting circuits. In some embodiments, the first diode circuit is connected between a first voltage-supplying node and the first output node. In some embodiments, the second diode circuit is connected between a second voltage-supplying node and the second output node.

Another aspect of the present disclosure provides a method of operating a voltage circuit. The method comprises the following steps. A first input signal is received and inverted, and a first inverted signal is output. The first inverted signal is received and inverted, and a second inverted signal is output. A voltage level of a first output node is determined in response to the first and second inverted signals. A voltage level of a second output node is determined in response to the first and second inverted signals. A voltage between a first voltage-supplying node and the first output node is decreased. A voltage between a second voltage-supplying node and the second output node is increased.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods and steps.

What is claimed is:
1. A voltage circuit, comprising:
 a first input signal-inverting circuit configured to receive an input signal and output a first inverted signal;
 a second input signal-inverting circuit configured to receive the first inverted signal from the first input signal-inverting circuit and output a second inverted signal;
 a first level-shifting circuit configured to determine a voltage level of a first output node in response to the first and second inverted signals;
 a second level-shifting circuit configured to determine a voltage level of a second output node in response to the first and second inverted signals;
 a first diode circuit connected between a first voltage-supplying node and the first output node; and
 a second diode circuit connected between a second voltage-supplying node and the second output node.

2. The voltage circuit of claim 1, wherein a phase of the first inverted signal is different from a phase of the second inverted signal.

3. The voltage circuit of claim 2, wherein a maximum voltage level and a minimum voltage level of the first output node are different from a maximum voltage level and a minimum voltage level of the second output node.

4. The voltage circuit of claim 1, wherein the first diode circuit includes a first number of diodes, and the second diode circuit include a second number of diodes.

5. The voltage circuit of claim 4, wherein the diodes of the first diode circuit are serially connected between the first voltage-supplying node and the first output node, and the diodes of the second diode circuit are serially connected between the second voltage-supplying node and the second output node.

6. The voltage circuit of claim 5, wherein the first number is equal to the second number.

7. The voltage circuit of claim 5, wherein the first number is different from the second number.

8. The voltage circuit of claim 5, wherein the first voltage-supplying node is a positive voltage and the second voltage-supplying node is a negative voltage.

9. The voltage circuit of claim 5, wherein the first diode circuit includes a first switch circuit connected to the diodes of the first diode circuit and configured to control a connection state of one of the diodes of the first diode circuit.

10. The voltage circuit of claim 8, wherein the second diode circuit includes a second switch circuit connected to the diodes of the second diode circuit and configured to control a connection state of one of the diodes of the second diode circuit.

11. The voltage circuit of claim 1, further comprising a first output circuit connected to the first output node and configured to output an output signal in response to the voltage level of the first output node.

12. The voltage circuit of claim 10, further comprising a second output circuit connected to the second output node and configured to output an output signal in response to the voltage level of the second output node.

13. The voltage circuit of claim 11, wherein the first output circuit comprises a first inverter configured to invert the voltage level of the first output node, and the second output circuit comprises a second inverter configured to invert the voltage level of the second output node.

14. The voltage circuit of claim 12, wherein the first diode circuit is connected between the first voltage-supplying node and the first inverter and configured to create a voltage decrease so that the first inverter is operated by a decreased voltage and a ground voltage, wherein the decreased voltage is lower than the first voltage-supplying node and higher than the ground voltage.

15. The voltage circuit of claim 13, wherein the second diode circuit is connected between the second voltage-supplying node and the second inverter and configured to create a voltage increase so that the second inverter is operated by an increased voltage and an external voltage, wherein the increased voltage is higher than the second voltage-supplying node and lower than the external voltage.

16. A method of operating a voltage circuit, the method comprising:
receiving and inverting a first input signal, and outputting a first inverted signal;
receiving and inverting the first inverted signal, and outputting a second inverted signal;
determining a voltage level of a first output node in response to the first and second inverted signals;
decreasing a voltage between a first voltage-supplying node and the first output node;
determining a voltage level of a second output node in response to the first and second inverted signals; and
increasing a voltage between a second voltage-supplying node and the second output node.

17. The method of claim 16, wherein the first voltage-supplying node provides a positive voltage and the second voltage-supplying node provides a negative voltage.

18. The method of claim 16, wherein a maximum voltage level and a minimum voltage level of the first output node are different from a maximum voltage level and a minimum voltage level of the second output node.

19. The method of claim 16, further comprising configuring a first diode circuit to determine a voltage decrease between the first voltage-supplying node and the first output node.

20. The method of claim 16, further comprising configuring a second diode circuit to determine a voltage increase between the second voltage-supplying node and the second output node.

* * * * *